United States Patent
Rajagopalan et al.

(10) Patent No.: US 6,465,338 B1
(45) Date of Patent: Oct. 15, 2002

(54) METHOD OF PLANARIZING DIE SOLDER BALLS BY EMPLOYING A DIE'S WEIGHT

(75) Inventors: Sarathy Rajagopalan, Fremont, CA (US); Kishor V. Desai, Fremont, CA (US); Zafer S. Kutlu, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/612,867

(22) Filed: Jul. 10, 2000

(51) Int. Cl.$^7$ ............................................... H01L 21/44
(52) U.S. Cl. ....................................................... 438/615
(58) Field of Search ................................ 438/613, 612, 438/615, 108

(56) References Cited

U.S. PATENT DOCUMENTS

| | | | |
|---|---|---|---|
| 4,661,192 A | * | 4/1987 | Mcshane |
| 5,129,573 A | * | 7/1992 | Duffey |
| 5,376,588 A | | 12/1994 | Pendse |
| 5,435,482 A | * | 7/1995 | Variot et al. |
| 5,641,946 A | * | 6/1997 | Shim |
| 5,696,027 A | | 12/1997 | Crane, Jr., et al. |
| 5,716,222 A | * | 2/1998 | Murphy ........................ 439/91 |
| 5,813,115 A | * | 9/1998 | Misawa et al. |
| 5,952,726 A | | 9/1999 | Liang |
| 5,984,164 A | * | 11/1999 | Wark |
| 6,048,753 A | | 4/2000 | Farnworth et al. |
| 6,064,113 A | | 5/2000 | Kirkman |
| 6,111,756 A | | 8/2000 | Moresco |
| 6,119,925 A | * | 9/2000 | Lin et al. |
| 6,198,635 B1 | | 3/2001 | Shenoy et al. |
| 6,267,650 B1 | * | 7/2001 | Hembree ........................ 451/49 |
| 6,365,438 B1 | * | 4/2002 | Ishida et al. ................. 438/118 |

* cited by examiner

*Primary Examiner*—Olik Chaudhuri
*Assistant Examiner*—Stephen W. Smoot
(74) *Attorney, Agent, or Firm*—Luedeka, Neely & Graham, PC

(57) ABSTRACT

Disclosed is a method of planarizing an array of plastically-deformable electrical contacts on an integrated circuit. An integrated circuit is placed on a plate with an array of plastically-deformable electrical contacts substantially parallel to and facing the plate, thereby creating an assembly. The integrated circuit is placed above the plate such that the weight of the integrated circuit bears down on the array of plastically-deformable electrical contacts. The assembly is then heated sufficiently to cause individual ones of the plastically-deformable electrical contacts to locally soften but not to cause said individual ones of the electrical contacts to liquefy throughout their volumes. The weight of the integrated circuit applies a force to the softened plastically-deformable electrical contacts, thereby resulting in their planarization.

1 Claim, 1 Drawing Sheet

METHOD OF PLANARIZING DIE SOLDER BALLS BY EMPLOYING A DIE'S WEIGHT

BACKGROUND OF THE INVENTION

1. Field of the Invention

The present invention is in the field of integrated circuits. More particularly, the present invention is in the field of flip-chip packages and methods and apparatus pertaining to planarizing the solder bumps on the surface of an integrated circuit die intended to be part of a flip-chip package.

2. Description of the Related Art

In flip-chip packages, the active face of an integrated circuit die has solder bumps thereon for coupling to a substrate. The die is brought into contact with the substrate such that solder bumps are aligned with solder bump pads on the substrate and the resulting structure is then heated, such that the solder bumps reflow and mechanically couple with the solder bump pads on the substrate.

When an integrated circuit die with its depending array of solder balls is placed on a substrate, which has been prepared with pads of solder paste (solder particles in flux) on the contacts of the circuit board, if the die and substrate are sufficiently planar, then each of the solder balls will contact its corresponding pad of solder paste. Subsequently, when the die and substrate are heated in the solder reflow furnace, the reflowed solder balls and coalescing solder paste will join by mutual surface tension.

However, current solder paste dispense processes result in solder bumps with varying heights. If solder bumps do not contact their corresponding solder paste contact pads, then mutual surface tension is not developed at these locations. When the solder paste and solder balls which are not contacting one another are reflowed, the surface tension of each tends to make them flatten out along their respective surfaces, and actually draw away from one another. Consequently, an electrical connection is generally not effected at the solder balls which do not contact their corresponding pads of solder paste. Also, the solder balls which do not electrically contact their corresponding substrate contact do not participate in the physical securing of the die to the substrate. Moreover, the physical mounting of the die to the substrate is also compromised when solder balls do not join with their corresponding solder paste pads.

One solution to an analogous problem is disclosed in U.S. Pat. No. 5,745,986. This patent discloses a method for planarizing solder balls disposed on the bottom surface of a substrate (as opposed to a die) of a flip chip package. According to this method, a planar surface is brought into contact with the solder balls, which are heated. The force of the planar surface against the heated solder balls results in the planarization of the solder balls.

The technique described in U.S. Pat. No. 5,745,986 is quite effective. However, it would be relatively expensive and time consuming to implement this method in the context of planarizing solder balls on a die surface (as opposed to a substrate surface). Therefore, it would be desirable improve upon this method in the context of planarizing solder balls on a die surface.

SUMMARY OF THE INVENTION

The present invention comprises a method of planarizing an array of plastically-deformable electrical contacts on an integrated circuit. According to the present invention, an integrated circuit is placed on a plate with an array of plastically-deformable electrical contacts substantially parallel to and facing the plate, thereby creating an assembly. The integrated circuit is placed above the plate such that the weight of the integrated circuit bears down on the array of plastically-deformable electrical contacts. The assembly is then heated sufficiently to cause individual ones of the plastically-deformable electrical contacts to locally soften but not to cause said individual ones of the electrical contacts to liquefy throughout their volumes. The weight of the integrated circuit applies a force to the softened plastically-deformable electrical contacts, thereby resulting in their planarization.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1A:
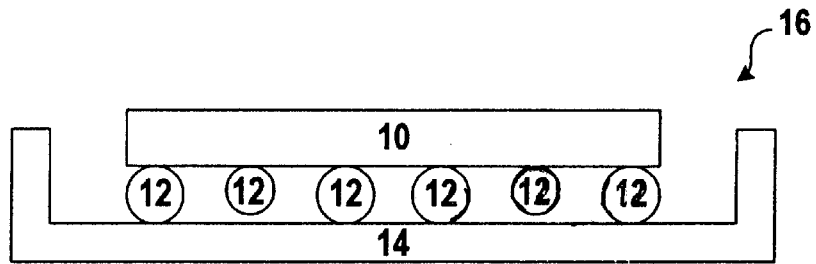
FIGS. 1a and 1b show a possible method of planarizing die solder balls according to the present invention.
Figure 1B:
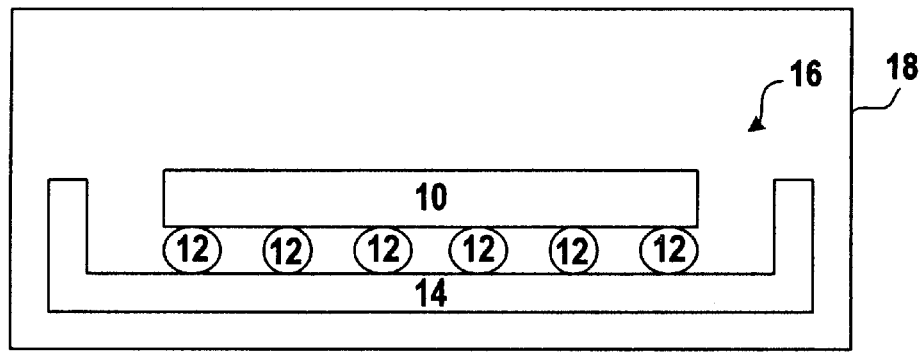

FIGS. 1a through 1b shows a possible method of planarizing die solder balls according to the present invention. As shown in FIG. 1a, an integrated circuit die 10, with a plurality of solder balls 12 (more generally, an array of plastically-deformable electrical contacts) disposed thereon, on a plate 14. The plate 14 is preferably glass or titanium but can be comprised of many other materials, including ceramic, graphite, stainless steel. The plate 14 can also be a silicon wafer substrate. The die 10 is placed such that it is above the plate 14, with the plurality of solder balls 12 substantially parallel to and facing the plate 14. As a result, the weight of the integrated circuit die 10 bears on the plurality of solder balls 12.

As shown in FIG. 1b, an assembly 16 comprising the die 10 and the plate 12 is heated sufficiently to cause individual ones of the solder balls 12 to locally soften but not to cause individual ones of the solder balls 12 to liquefy throughout their volumes. Preferably, the heating is performed by a conveyor belt forced convection oven 18. The weight of the integrated circuit die 10 presses down on the softened solder bumps 12, resulting in the planarization of the plurality of solder bumps 12.

It will be appreciated that standard processing steps will typically be performed in conjunction with the method shown in FIGS. 1a–1b. For example, flux will usually be applied before the die 10 is placed on the plate 12 and the flux will be cleaned off after the assembly 16 has been heated.

Figure 2:
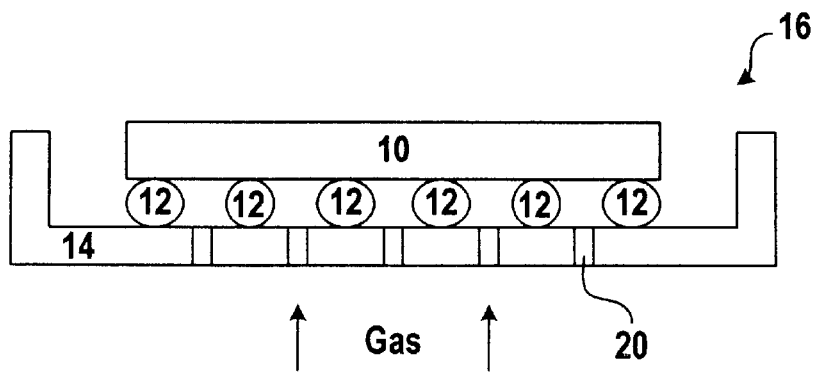
FIG. 2 shows an alternate method of planarizing die solder balls according to the present invention While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

FIG. 2 shows an alternate method of planarizing die solder balls 12 according to the present invention. According to the method shown in FIG. 2, the die 10 is placed on a titanium plate 14 with a plurality of holes 20 therein. The resulting assembly 16 is heated by applying hot gas to the underside of the titanium plate 14.

CONCLUSION

Numerous variations and modifications will become apparent to those skilled in the art once the above disclosure is fully appreciated. It is intended that the following claims be interpreted to embrace all such variations and modifications.

What is claimed is:

1. A method of planarizing an array of plastically-deformable electrical contacts on an integrated circuit, the method comprising the steps of:

placing the integrated circuit on a plate having a plurality of holes, with the array of plastically-deformable electrical contacts substantially parallel to and facing the plate, thereby creating an assembly, and heating the assembly sufficiently to cause individual ones of the plastically-deformable electrical contacts to locally soften but not to cause said individual ones of the electrical contacts to liquefy throughout their volumes, the heating accomplished by applying hot gas through the holes in the plate, wherein the step of heating the assembly is performed at least partially when the integrated circuit is above the plate such that the weight of the integrated circuit bears down on the array of plastically-deformable electrical contacts, thereby selectively distorting said electrical contacts so they cooperatively define a planar array.

* * * * *